(12) United States Patent
Zhang et al.

(10) Patent No.: US 7,253,094 B1
(45) Date of Patent: Aug. 7, 2007

(54) METHODS FOR CLEANING CONTACT OPENINGS TO REDUCE CONTACT RESISTANCE

(75) Inventors: Jie Zhang, San Jose, CA (US); Vinay Krishna, Apple Valley, MN (US); Chan-Lon Yang, Los Gatos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 109 days.

(21) Appl. No.: 10/993,031

(22) Filed: Nov. 19, 2004

Related U.S. Application Data

(60) Provisional application No. 60/531,788, filed on Dec. 22, 2003.

(51) Int. Cl.
*H01L 21/4763* (2006.01)
(52) U.S. Cl. .................. 438/618; 438/624; 438/722
(58) Field of Classification Search ........ 438/618–625, 438/722
See application file for complete search history.

(56) References Cited

U.S. PATENT DOCUMENTS 6,174,766 B1 * 1/2001 Hayashi et al. ............. 438/241
6,878,646 B1 * 4/2005 Tsai et al. .................. 438/756
2004/0038530 A1 * 2/2004 Shin et al. .................. 438/685

* cited by examiner

*Primary Examiner*—H. Jey Tsai
(74) *Attorney, Agent, or Firm*—Kevin L. Daffer; Mollie E. Lettang; Daffer McDaniel, LLP

(57) ABSTRACT

A method for processing a semiconductor topography which includes removing metal oxide layers from the bottom of contact openings is provided. In some embodiments, the method may include etching openings within a dielectric layer to expose conductive and silicon surfaces within the semiconductor topography is provided. In such cases, the method further includes exposing the semiconductor topography to an etch process adapted to remove metal oxide material from the conductive surfaces without substantially removing material from the silicon surfaces. In some cases, the etch chemistry used for the etch process may include sulfuric acid. In addition or alternatively, the etch chemistry may include hydrogen peroxide. In any case, the etch chemistry may be distinct from chemistries used to remove residual matter generated from the etch process used to form the openings within the dielectric and/or the removal of the masking layer used to pattern the openings.

19 Claims, 5 Drawing Sheets

METHODS FOR CLEANING CONTACT OPENINGS TO REDUCE CONTACT RESISTANCE

PRIORITY APPLICATION

The present application claims priority to provisional application No. 60/531,788 entitled "Method for Cleaning Contact Openings to Reduce Contact Resistance of a Resulting Device," filed Dec. 22, 2003.

BACKGROUND OF THE INVENTION

1. Field of the Invention

This invention relates to semiconductor processing and, more particularly, to methods for processing a semiconductor topography having openings etched within a dielectric layer.

2. Description of the Related Art

The following descriptions and examples are given as background information only.

In the fabrication of microelectronic devices, numerous conductive structures, such as gate electrodes, contacts, vias and interconnects, may be formed in or above a semiconductor substrate isolated from one another by dielectric layers. At various stages in the fabrication of microelectronic devices, it may be necessary to form openings in the dielectric layers to allow for contact to underlying regions or layers. Generally, an opening through a dielectric layer exposing a diffusion region of a semiconductor substrate or an opening through a dielectric layer between a gate electrode and a first metal layer is called a "contact opening" or a "contact hole." An opening in other dielectric layers such as an opening through an interlevel dielectric layer is referred to as a "via opening." For purposes of this disclosure, however, "contact opening" may be used to refer to a contact opening and/or a via opening interchangeably. As such, a contact opening, as used herein, may expose a diffusion region such as, a source or drain, or may expose metallization such as, a local interconnect layer or gate structure.

After a contact opening has been formed within a dielectric layer, the opening may be cleaned. The cleaning process may remove small amounts of debris and residual material formed on sidewalls and/or the bottom surface of the contact opening during the formation of the contact opening and/or the removal of an overlying photoresist mask used to pattern the opening. Such a cleaning process, however, is not typically sufficient to remove metal oxide layers formed upon exposed conductive structures. In some cases, the deposition of a dielectric layer over metallization may oxidize an upper portion of the metallization, forming a metal oxide layer. Such a metal oxide layer may undesirably increase the contact resistance of the metallization. In particular, the resulting surface of the metallization may have a contact resistance of approximately 2000 ohms. Consequently, it may be advantageous to remove or prevent the formation of metal oxide layers within contact openings. Although etch chemistries for removing metal oxide materials exist, conventional metal oxide layer removal chemistries are typically apt to etch silicon materials as well. As such, in embodiments in which a plurality of contact openings are formed across a semiconductor topography with exposed silicon and metallization surfaces, an etch chemistry used to remove metal oxide may undesirably etch the exposed portions of silicon as well. Such an affinity to silicon may cause gouges within a semiconductor substrate or field-oxide regions of the semiconductor topography. In some cases, the gouges may undesirably affect the functionality of the device formed therefrom.

Accordingly, it would be advantageous to develop a method for removing metal oxide materials within contact openings. In particular, it would be beneficial to develop a method with a substantially higher etch selectivity to metal oxide than silicon materials. Such a method may advantageously offer a semiconductor topography with conductive structures having reduced contact resistances and silicon surfaces which have not been gouged.

SUMMARY OF THE INVENTION

The problems outlined above may be in large part addressed by methods for processing a semiconductor topography which include removing metal oxide layers from the bottom of contact openings. In some embodiments, the methods may be used to remove metal oxide layers from openings formed within interlevel dielectric layers (i.e., dielectric layers formed between different layers of interconnect within a semiconductor topography). In other embodiments, however, the methods may be used to remove metal oxide layers within openings formed within premetal dielectric layers (i.e., dielectric layers formed between a gate structure and a first interconnect line of a semiconductor topography). In such a case, the method may include etching openings within a dielectric layer to expose at least one conductive surface and at least one silicon surface within the semiconductor topography. In a preferred embodiments, the method includes exposing the semiconductor topography to an etch process adapted to remove metal oxide material from the conductive surface without substantially removing material from the silicon surface. In particular, the etch process may be configured such that less than approximately 15 nanometers of the silicon surface is removed while a sufficient amount of the metal oxide material is removed such that the resulting conductive surface has an average surface resistance less than approximately 20 ohms.

In some cases, the method may include removing a photoresist mask used to pattern the openings. In addition or alternatively, the method may include cleaning the semiconductor topography of etch residues generated from the formation of the openings and/or removal of the photoresist mask. In such embodiments, the removal of the metal oxide materials may include exposing the semiconductor topography to an etch chemistry distinct from the etch chemistries used to remove the photoresist layer and clean the semiconductor topography. In some cases, removing the metal oxide material may be conducted subsequent to cleaning the semiconductor topography. In other cases, removing the metal oxide material may be conducted prior to cleaning the semiconductor topography.

In either case, the removal of the metal oxide material may be conducted using a number of different etch processes. For example, in some embodiments, the removal of the metal oxide material may include exposing the semiconductor topography to an etch chemistry which includes sulfuric acid and is substantially absent of hydrogen peroxide. In such embodiments, the etch chemistry may be introduced to the semiconductor topography at a temperature between approximately 75° C. and approximately 300° C. In addition, the etch process may be followed by rinsing the semiconductor topography with deionized water which is substantially absent of ozone. In other cases, the removal of the metal oxide material may include exposing the semiconductor topography to an etch chemistry comprising sulfuric acid and hydrogen peroxide. For example, the etch chemistry may include a ratio of sulfuric acid to hydrogen peroxide between approximately 5:1 and approximately 20:1. In such embodiments, the etch chemistry may be introduced to the semiconductor topography at a temperature between approximately 40° C. and approximately 170° C.

Other etch chemistries including sulfuric acid may also or alternatively be used for removing metal oxide material. For example, an etch chemistry including sulfuric acid and nitric acid may be used. In yet other embodiments, an etch chemistry including hydrogen peroxide and hydrochloric acid may used to remove metal oxide material. For example, an etch chemistry including a ratio of hydrochloric acid, hydrogen peroxide and deionized water between approximately 1:1:5 and approximately 1:1:20 may be used. In such embodiments, the etch chemistry may be introduced to the semiconductor topography at a temperature between approximately 15° C. and approximately 45° C. In other embodiments, an etch chemistry comprising hydrogen peroxide without sulfuric acid or hydrochloric acid may be used. In any case, the etch chemistries described herein may be used to remove several different metal oxide materials, including but not limited to tungsten oxide.

There may be several advantages to processing a semiconductor topography in the manner described herein. In particular, contact structures may be formed having surface resistance of less than approximately 20 ohms. As a result, a device formed therefrom may use a smaller amount of voltage as compared to a device having a higher average of contact resistance. In addition, the methods described herein allow contact openings configured for contact to different structures to be formed simultaneously. In particular, the methods allow contact openings exposing conductive surfaces as well as contact openings exposing silicon surfaces to be formed simultaneously. More specifically, the methods advantageously allow metal oxides to be removed from contact openings exposing conductive structures without gouging silicon surfaces exposed by other contact openings. In this manner, the reliability of a device formed from such a topography may have a relatively high reliability as compared to a device in which the semiconductor substrate has been substantially gouged.

BRIEF DESCRIPTION OF THE DRAWINGS

Other objects and advantages of the invention will become apparent upon reading the following detailed description and upon reference to the accompanying drawings in which.

Figure 1:
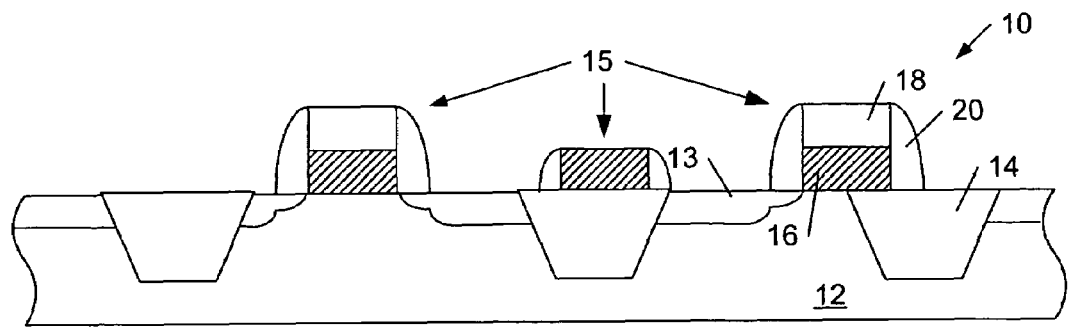
FIG. 1 depicts a partial cross-sectional view of a semiconductor topography having a plurality of gate structures formed upon a semiconductor layer.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary methods for cleaning contact openings are shown in FIGS. 1-11. In general, the methods described herein may be used for cleaning contact openings or via openings. As noted above, contact openings may refer to openings formed within a premetal dielectric layer and via openings may refer to openings formed within interlevel dielectric layers. For purposes of this disclosure, however, "contact opening" may be used to refer to a contact opening and/or a via opening interchangeably. The reference to the type of opening (i.e., a contact or via opening) cleaned may be distinguished by the level at which the opening is formed. As used herein, a premetal dielectric layer may refer to an insulator layer interposed between gate electrodes and a first metal layer of interconnects. An interlevel dielectric layer, on the other hand, may refer to an insulator layer interposed between two levels of interconnects. FIGS. 1-8 specifically reference the formation and cleaning of contact openings within premetal dielectric layers and FIGS. 9-11 reference cleaning of via openings within interlevel dielectric layers.

FIG. 1 illustrates a partial cross-sectional view of semiconductor topography 10 including a plurality of gate structures 15 formed upon semiconductor layer. It is noted that although three gate structures are shown, any number of gate structures may be included within semiconductor topography 10. In addition, gate structures 15 may be formed upon any portion of semiconductor layer 12, including diffusion regions 13 and isolation regions 14 as shown in FIG. 1. In general, the placement of gate structures 15 relative to the diffusion regions 13 and isolation regions 14 may be dependent on their intended function and the design specifications of the device. Consequently, the placement of gate structures within semiconductor topography 10 is not necessarily restricted to the placement of gate structures 15 depicted in FIG. 1.

Semiconductor layer 12 may be a semiconductor substrate such as a silicon substrate, and may be doped either n-type or p-type. More specifically, semiconductor layer 12 may be a monocrystalline silicon substrate or a silicon-germanium substrate. Alternatively, semiconductor layer 12 may include an epitaxial layer arranged upon an interlevel dielectric forming a silicon-on-insulator (SOI) base on which structures and layers may be formed. Consequently, semiconductor layer 12 may, in some cases, include structures and layers formed upon a semiconductor substrate. The structures and layers may include, but are not limited to, dielectric layers, metallization layers, gate structures, contact structures, vias, or local interconnect wires. In such embodiments, the upper surface of semiconductor layer 12 may include an interlevel dielectric layer formed upon the structures and layers. In any case, semiconductor layer 12 may include isolation regions 14 in some embodiments. In addition, semiconductor layer 12 may include diffusion regions 13, such as source and drain regions, as shown in FIG. 1.

Figure 3:
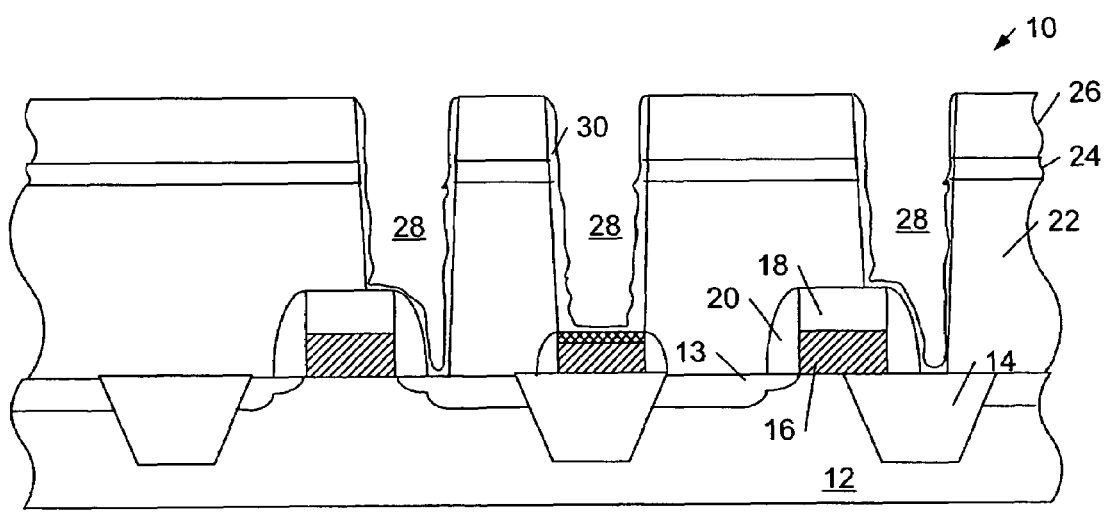
FIG. 3 depicts a partial cross-sectional view of the semiconductor topography having openings formed within the dielectric layer subsequent to a deposition of a cap layer and a masking layer upon the dielectric layer deposited in FIG. 2.

In general, gate structures 15 may be fabricated by patterning a lower conductive layer and an upper dielectric layer to form lower portion 16 and upper portion 18, respectively. In other embodiments, upper portion 18 may be omitted from gate structures 15 as shown for the middle gate structure in FIG. 1. In general, composition of gate structures 15 to include upper portion 18 may be dependent on the design specifications of the device or, more specifically, whether a self-aligned contact opening will be formed adjacent to a gate structure. A self-aligned contact structure, as used herein, may generally refer to a contact structure which is formed over portion of a gate structure and a diffusion region or an isolation region adjacent to the gate structure. In general, self-aligned contact structures are configured to make contact with the diffusion region or isolation region. In order to prevent the contact structure from shorting out to the well beneath the gate structure, the gate structure is insulated with a dielectric layers (e.g., upper portion 18 and spacers 20 as described in more detail below) to prevent contact with the contact structure. FIG. 3, described in more detail below, illustrates the formation of exemplary contact openings which may be used to subsequently form self-aligned contact structures over the outermost gate structures of semiconductor topography 10. In general, self-aligned contact structures may eliminate alignment problems associated with typical contact structures and may increase the device density of a structure. In particular, less contact area may be needed and, therefore, gates may be moved closer together.

In general, lower portion 16 may include any conductive material, such as doped amorphous silicon, doped polysilicon, aluminum, copper, titanium, tungsten, or any metal alloy, nitride or silicide thereof. In addition, lower portion 16 may include any number of layers of conductive materials. In some embodiments, it may be particularly advantageous for the uppermost layer of lower portion 16 to include tungsten, such as tungsten nitride or any alloy of tungsten, since the etch chemistries described herein may be particularly suitable for removing portions of oxides of tungsten materials. The etch chemistries are, however, not necessarily restricted to the removal of tungsten oxides. In some cases, lower portion 16 may further include a gate oxide layer interposed between semiconductor layer 12 and the conductive material/s. Such a gate oxide layer, however, is not shown in FIG. 1 to simplify the drawing.

The thicknesses of upper and lower portions 16 and 18 may generally be between approximately 300 angstroms and approximately 3000 angstroms or more specifically, approximately 1000 angstroms. However, larger or smaller thicknesses of upper and lower portions 16 and 18 may be appropriate depending on the design specifications of the device. As noted above, upper portion 18 may include a dielectric material to isolate the upper surface of lower portion 16 from overlying layers and structures. For example, upper portion 18 may include silicon dioxide, silicon nitride, or silicon oxynitride. In addition, gate structures 15 may include sidewall spacers 20. In general, sidewall spacers 20 may be formed by depositing a dielectric material over upper portion 18, lower portion 16 and adjacent portions of semiconductor layer 12. Subsequently, the deposited layer may be aniostropically etched to form sidewall spacers 20 along the sidewalls of upper portion 18 and lower portion 16. In general, sidewall spacers 20 may include a dielectric material, such as silicon dioxide or silicon nitride, for example.

Figure 2:
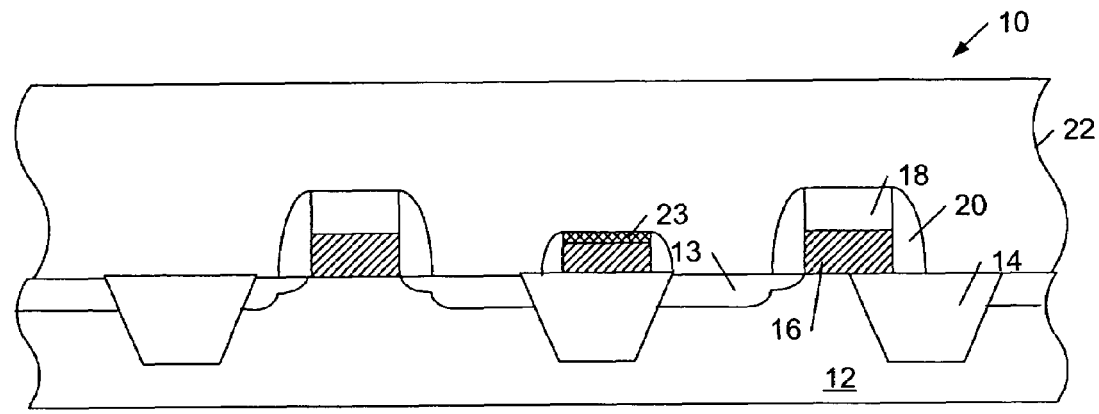
FIG. 2 depicts a partial cross-sectional view of the semiconductor topography in FIG. 1 subsequent to the deposition of a dielectric layer upon the gate structures.

As shown in FIG. 2, a dielectric layer may be formed upon gate structures 15 and exposed portions of semiconductor layer 12 and be subsequently planarized to form dielectric layer 22. Since dielectric layer 22 is formed directly over gate structures 15 and a first level of interconnect structures may be formed over the dielectric layer, dielectric layer 22 may be a premetal dielectric layer. In general, dielectric layer 22 may include any dielectric material such as, silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, dielectric layer 22 may be doped or updoped. As such, in some embodiments, dielectric layer 22 may include borophosphorus silicate glass (BPSG), phosphorus silicate glass (PSG), or fluorine silicate glass (FSG). In addition, dielectric layer 22 may include a low-permittivity ("low-k") dielectric, generally known in the art as a dielectric having a dielectric constant of less than about 3.5. One low-k dielectric in current use, which is believed to make a conformal film, is fluorine-doped silicon dioxide.

In some embodiments, it may be advantageous for dielectric layer 22 to include PSG. In particular, a PSG layer may provide a variance in etch characteristics within semiconductor topography 10, particularly relative to silicon, silicon oxide and silicon nitride materials. Such a variance may be advantageous for forming contact openings within dielectric layer 22. In particular, etch chemistries used for the formation of contact openings may be configured to have a high selectivity to PSG over silicon oxide and/or silicon nitride such that substantial portions of upper portion 18, spacers 20, field oxide regions 14 and diffusion regions 13 are not removed. Other dielectric materials may offer similar or better variances in etch selectivity and, therefore, may be beneficial to used as well. In any case, appropriate thicknesses for dielectric layer 22 may be between approximately 2000 angstroms and approximately 7000 angstroms or, more preferably, between approximately 3000 angstroms and approximately 5000 angstroms. For instance, dielectric layer 22 may, in some embodiments, include a thickness of approximately 4000 angstroms. Larger or smaller thicknesses of dielectric layer 22, however, may be appropriate depending on the design specifications of the device being formed.

As shown in FIG. 2, the deposition of dielectric layer 22 may form metal oxide layer 23 upon lower portion 16 of the middle gate structure. In particular, the deposition of dielectric layer 22 may oxidize an upper portion of lower portion 16 to form metal oxide layer 23. Since the gate structures on opposing sides of the middle gate structure are encompassed by dielectric materials of upper portion 18 and sidewall spacers 20, portions of such gate structures may not be transposed into metal oxide layers. As noted above, a metal oxide layer may undesirably increase the contact resistance of a gate structure. As such, it may be desirable to remove metal oxide layer 23 prior to forming structures in contact the middle gate structure.

As shown in FIG. 3, cap layer 24 and masking layer 26 may be formed upon dielectric layer 22 and subsequently patterned to form openings 28 extending through dielectric layer 22. In some embodiments, cap layer 24 may serve to prevent outdiffusion from dielectric layer 22 during subsequent thermal processes and/or may prevent moisture from migrating into dielectric layer 22. Cap layer 24 may also provide a more level surface for subsequent layers to be formed upon. Exemplary materials for cap layer 24 may be an undoped silicon dioxide and silicon nitride layer, although other materials may be used in some embodiments. In addition, an exemplary thickness for cap layer may generally be between approximately 20 angstroms and approximately 500 angstroms, but larger or smaller thicknesses may be appropriate in some cases.

Masking layer 26 may be formed upon cap layer 24 in a pattern with which to outline openings 28 from cap layer 24 and dielectric layer 22. In this manner, portions of cap layer 24 and dielectric layer 22 underlying masking layer 26 may be protected during the formation of openings 28. In some embodiments, masking layer 26 may be a hardmask layer. For example, in some cases, masking layer 26 include a dielectric material such as silicon nitride or silicon oxynitride. In addition or alternatively, masking layer 26 may include a metal nitride layer, such as titanium nitride or tungsten nitride, for example. In other embodiments, masking layer 26 may include a photoresist, such as a deep ultraviolet resist, an I-line resist, a G-line resist, or another resist, such as an e-beam resist or an x-ray resist. Depending on the application, the thickness of masking layer 26 may generally be between approximately 20 angstroms and approximately 1000 angstroms. However, larger or smaller thicknesses may be appropriate for masking layer 26, depending on the design specifications of the semiconductor topography.

In general, the etch process used to form openings 28 may include a wet etch process or a dry etch process, depending on the specifications of the fabrication process and/or the design specifications of the semiconductor topography. The type of process as well as the particular etch chemistry used will depend on a number of parameters. For instance, the type of etch process and etch chemistry used may depend the characteristics of the dielectric being etched, the stage of processing, the etch tool being used, and the desired etch characteristics, such as etch rate, wall slope, and anisotropy, among others. An exemplary etch chemistry that may be used to form openings 28 may include one or more halocarbons and/or one or more other fluorinated compounds, such as $CF_4$, $CHF_3$, $SF_6$, and/or $NF_3$. An etch chemistry including halocarbons and/or fluorinated compounds may be advantageous for inducing high selectivity between dielectric layer 22 and underlying silicon-containing structures, particularly when dielectric layer 22 includes PSG.

In addition, an etch chemistry including halocarbons and/or fluorinated compounds may be advantageous for producing openings with substantially vertical sidewalls. Such steep sidewalls may be attributed, at least in part, to the formation of polymer 30 along the sidewalls and bottom of openings 28 shown in FIG. 3. In particular, polymer 30, which generally includes carbon residue from the etch process, may adhere to the sidewalls of the opening, substantially inhibiting etching in the lateral direction (i.e., substantially preventing removal of portions of cap layer 24 and dielectric layer 22 underlying masking layer 26). One disadvantage of the formation of polymer 30, however, is that it makes subsequently deposited material difficult to adhere to the sidewalls and bottom surface of openings 28. Consequently, polymer 30 is preferably removed prior to depositing material within openings 28. An exemplary stripping process is described below in reference to the removal of masking layer 26. In other embodiments, however, polymer 30 may be removed by etch chemistries other than the one used to remove masking layer 26.

As illustrated in FIG. 3, openings 28 may expose upper surfaces of gate structures 15 and semiconductor layer 12. More specifically, the two outermost openings expose upper surfaces of upper portion 18, sidewall spacers 20, diffusion regions 13, and isolation regions 14. Such openings are referenced as self aligned to the gate structures and are used to subsequently form self-aligned contact structures. Conversely, the middle opening exposes lower portion 16 of the middle gate structure to which contact may be subsequently made. Although the method described herein is particularly advantageous for embodiments in which portions of conductive and silicon surfaces are exposed within openings in a dielectric layer, the method may be used when silicon surfaces are not exposed. As such, in some embodiments, the two outermost openings 28 may not be formed. In addition, although three openings are formed within cap layer 24 and dielectric layer 22, any number of openings may be formed within and laterally spaced across semiconductor topography 10. Furthermore, openings 28 may be of differing widths and lateral space dimensions.

Figure 4:
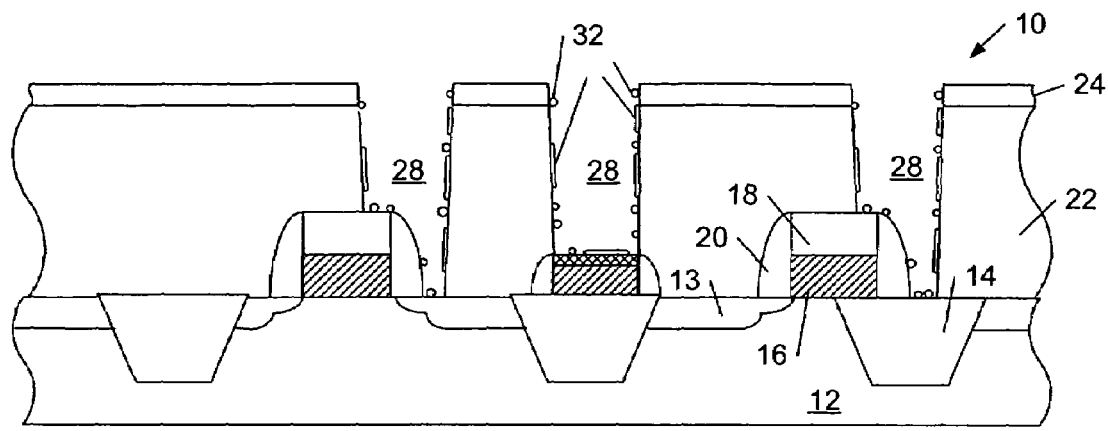
FIG. 4 depicts a partial cross-sectional view of the semiconductor topography in which the masking layer has been removed subsequent to the formation of the openings in FIG. 3.

As shown in FIG. 4, masking layer 26 may be removed subsequent to the formation of openings 28. Such a removal may include stripping techniques such as a wet etch or reactive ion etch process. In some embodiments, the etch process used to remove masking layer 26 may be used to remove polymer 30 as well. For instance, an exemplary unit that may be used for such a dual-removal may be the Iridia System, manufactured by Novellus Systems Incorporated. Such a system may employ a gas etch chemistry comprising any one or combination of oxygen, nitrogen, nitrogen trifluoride and/or hydrogen to remove masking layer 26 and polymer 30. Other units and/or etch chemistries known for the dual-removal of masking materials and polymer materials may be used as well. In yet other embodiments, the removal of masking layer 26 and polymer 30 may employ distinct etch chemistries. In any case, residual material 32 may still reside within openings 28 subsequent to the removal of masking layer 26 and polymer 30. Such residue may include etch byproducts from the formation of openings 28 and/or etch byproducts from the removal of masking layer 26 and polymer 30. In particular, residual material 32 may include individual particles or compounds of masking layer 26 and polymer 30 as well as cap layer 24, dielectric layer 22, upper portion 18, lower portion 16, sidewall spacers 20 and/or semiconductor layer 12.

Figure 5:
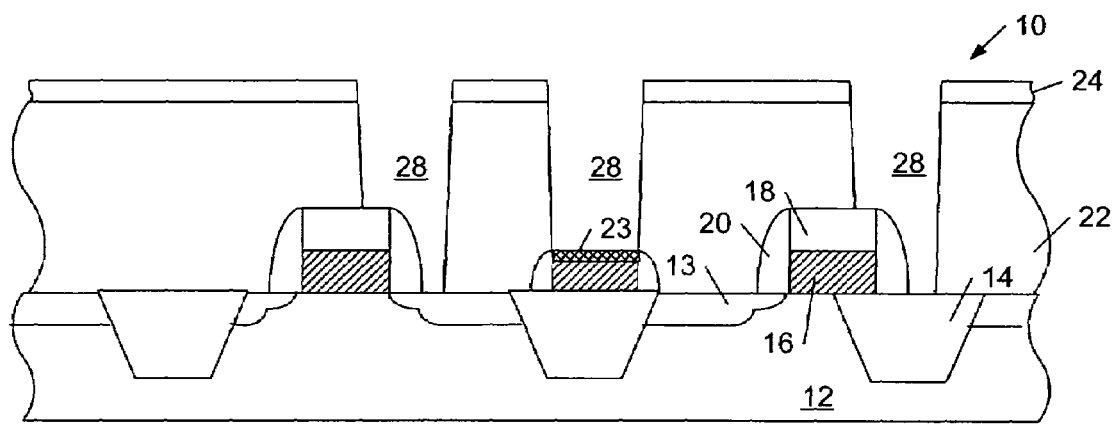
FIG. 5 depicts a partial cross-sectional view of the semiconductor topography in which etch residues are removed subsequent to the removal of the masking layer in FIG. 4.
Figure 6:
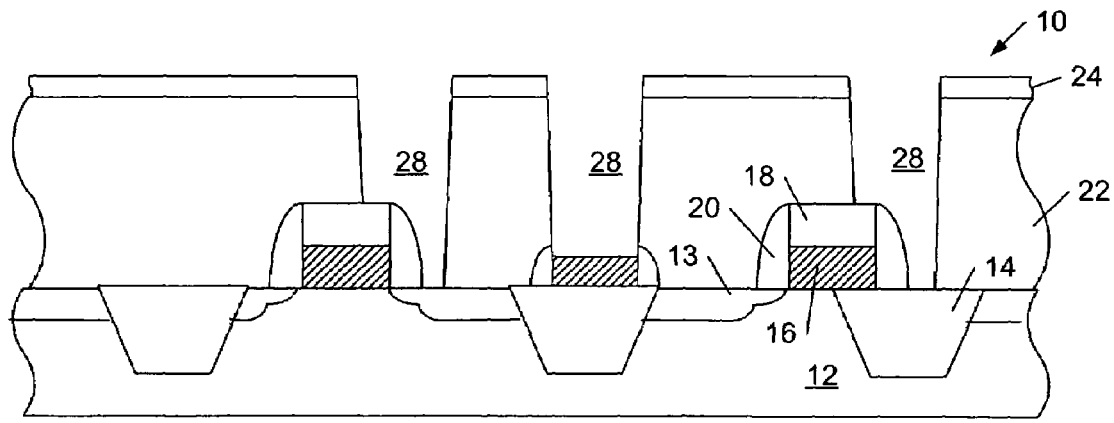
FIG. 6 depicts a partial cross-sectional view of the semiconductor topography having a metal oxide layer removed from a gate structure subsequent to the removal of the etch residues in FIG. 5.

In general, it may be advantageous to remove residual material 32 such that a material subsequently deposited within openings 28 may sufficiently adhere to the sidewalls and bottom surface of the openings. As shown in FIG. 5, residue material 32 may be removed during a cleaning process performed subsequent to the removal of masking layer 26. In some cases, the cleaning process may involve an etch chemistry distinct from the etch chemistry used to remove masking layer 26 and polymer 30. For example, DuPont Electronic Technologies of Danville, Calif. provides a series of PlasmaSolv® products that may be used to remove residue 32. Such a series of etch chemistries are proprietary, but may generally include hydroyl amines and deionized water as well as any proprietary chemicals for removing residue 32. Other etch chemistries known for removing post etch residue during the fabrication of semiconductor devices may be used as well or alternatively. In general, the cleaning process may be conducted at a temperature between 35° C. and approximately 100° C. and, more preferably, between approximately 55° C. and approximately 85° C. In addition, the cleaning process may be conducted for a duration between approximately 5 minutes and 15 minutes and, more preferably between approximately 8 minutes and approximately 12 minutes. For example, in some embodiments, the cleaning process may be conducted at 70° C. for approximately 10 minutes.

As shown in FIG. 5, semiconductor topography 10 may still include metal oxide layer 23 subsequent to the cleaning process used to remove residual material 32. In particular, the masking layer and polymer removal process and the cleaning process may not be sufficient to remove metal oxide layer 23. As such, another removal process distinct from those used to remove masking layer 26 and polymer 30 as well as residual material 32 may be employed in the method described herein. Such a removal process preferably uses an etch chemistry that may be sufficient to remove metal oxide layer 23 without removing substantial portions of semiconductor layer 12 and/or gate structures 15. In this manner, the etch chemistry used for the removal of metal oxide layer 23 is preferably selective to the material of metal oxide layer 23 over silicon materials.

A number of different chemistries may be used for the removal of metal oxide layer 23. For example, in some embodiments, the removal of metal oxide layer 23 may include exposing semiconductor topography 10 to an etch chemistry which includes sulfuric acid and is substantially absent of hydrogen peroxide. Such an etch chemistry may be introduced at a temperature between approximately 75° C. and approximately 300° C. and, more preferably, between approximately 125° C. and approximately 185° C. and, in some embodiments, at approximately 155° C. The etch process may be followed by rinsing semiconductor topography 10 with deionized water which is substantially absent of ozone and drying the topography. Such rinsing and drying processes may aid in prevent subsequent oxidation of the exposed conductive surface. The etch process may be conducted for a duration between approximately 10 minutes and 40 minutes and, more preferably between approximately 15 minutes and approximately 25 minutes and, in some embodiments, for approximately 10 minutes. In some cases, exposing semiconductor topography 10 to an etch chemistry which includes sulfuric acid but is substantially absent of hydrogen peroxide may involve immersing semiconductor topography 10 in a bath of such an etch chemistry. An exemplary unit that may be used for such a process may include an etch system provided by Akrion of Allentown, Pa., such as an Akrion GAMA unit. Other bath etch systems, however, may be used as well or alternatively. In other cases, the etch chemistry may be sprayed on semiconductor topography 10 to etch metal oxide layer 23.

In an alternative embodiment, the removal of the metal oxide layer 23 may include exposing semiconductor topography 10 to an etch chemistry comprising sulfuric acid ($H_2SO_4$) and hydrogen peroxide ($H_2O_2$). In some embodiments, such an etch chemistry may be heated to heat the semiconductor topography, enhancing the removal of the metal oxide material. In particular, the etch chemistry may be heated to a temperature between approximately 40° C. and approximately 170° C. or, more preferably, between approximately 70° C. and approximately 100° C. and, in some embodiments, at approximately 85° C. Such a heating process may advantageously heat semiconductor topography 10 to a temperature between approximately 50° C. and approximately 150° C. or, more preferably, between approximately 75° C. and approximately 125° C. In some embodiments, semiconductor topography 10 may be heated to a temperature of approximately 100° C.

In some embodiments, a heated flow of sulfuric acid may added to a flow of hydrogen peroxide to produce the etch chemistry. Exemplary flow rates of the sulfuric acid may range from approximately 400 cubic centimeters per minute (cc/min) and approximately 1200 cc/min or, more preferably, between approximately 650 cc/min and approximately 1000 cc/min. Exemplary flow rates of hydrogen peroxide may range from approximately 40 cc/min and approximately 120 cc/min or, more preferably, between approximately 65 cc/min and approximately 100 cc/min. In general, the ratio of $H_2SO_4$: $H_2O_2$ may be between approximately 5:1 and approximately 20:1 or, more specifically, approximately 10:1. For example, in some embodiments, approximately 800 cc/min of sulfuric acid may be heated to approximately 85° C. and then mixed with approximately 80 cc/min of hydrogen peroxide. In addition, removal of metal oxide layer 23 using an etch chemistry including sulfuric acid and hydrogen peroxide may be conducted for a duration between approximately 5 minutes and 20 minutes and, more preferably, between approximately 8 minutes and approximately 12 minutes and, in some embodiments, for approximately 10 minutes. In some cases, exposing semiconductor topography 10 to such an etch chemistry may involve a spraying processor, such as a Mercury System supplied by FSI International of Chaska, Minn. Other types of spraying processors, however, may be used as well or alternatively. In other cases, semiconductor topography 10 may be immersed in a bath of such an etch chemistry.

In alternative embodiments, the removal of metal oxide layer 32 may include exposing the semiconductor topography to an etch chemistry comprising hydrochloric acid (HCl) and hydrogen peroxide. In some embodiments, the etch chemistry may further include deionized water (DI $H_2O$). Exemplary flow rates of hydrochloric acid and hydrogen peroxide may range from approximately 75 cubic centimeters per minute (cc/min) and approximately 300 cc/min or, more preferably, between approximately 120 cc/min and approximately 180 cc/min. Exemplary flow rates of deionized water may range from approximately 750 cubic centimeters per minute (cc/min) and approximately 3000 cc/min or, more preferably, between approximately 1200 cc/min and approximately 1800 cc/min. The ratio of HCl:$H_2O_2$:DI $H_2O$ may generally be between approximately 1:1:5 and approximately 1:1:20 or, more specifically, approximately 1:1:10. For example, in some embodiments, approximately 1500 cc/min of deionized water may be mixed with approximately 150 cc/min of both hydrochloric acid and hydrogen peroxide.

In general, an etch chemistry including hydrogen peroxide and hydrochloric acid may be introduced to semiconductor topography 10 at a temperature between 15° C. and approximately 45° C. and, more preferably, between approximately 25° C. and approximately 35° C. and, in some embodiments, at approximately 30° C. Furthermore, a removal process employing an etch chemistry comprising hydrochloric acid and hydrogen peroxide may be conducted for a duration between approximately 2 minutes and approximately 10 minutes or, more specifically, between approximately 3.5 minutes and approximately 5.5 minutes and, in some embodiments, for approximately 4.5 minutes. Such a process time may advantageously reduce the fabrication time of the device relative to the aforementioned etch chemistries, increasing production throughput of a device formed therefrom. As with the etch chemistry comprising sulfuric acid and hydrogen peroxide, exposing semiconductor topography 10 to an etch chemistry comprising hydrochloric acid and hydrogen peroxide may involve a spraying processor. In other cases, however, the etch process may involve immersing semiconductor topography 10 in a bath of such an etch chemistry.

Other alternative etch chemistries may also be used for the removal of metal oxide layer 32. For example, in some embodiments, hydrogen peroxide alone may be used to remove metal oxide layer 23. In other cases, a mixture of nitric acid and sulfuric acid may be used to remove metal oxide layer 23. In any case, as noted above, the etch chemistry used to remove metal oxide layer 23 may preferably be non-selective to semiconductor layer 12. In this manner, gouging of diffusion regions 13 and isolation regions 14 may be prevented. In particular, portions of semiconductor layer 12 may be limited to a removal of less than approximately 15 nanometers and, in some embodiments, less than approximately 10 nanometers. Subsequent to FIG. 6, semiconductor topography 10 may be exposed to other processing steps with which to form a microelectronic device, including but not limited to the deposition of material within openings 28 and above dielectric layer 22. An exemplary progression of fabrication for semiconductor topography 10 is described below in reference to FIGS. 9-11. Since metal oxide layer 23 is removed prior to the deposition of material within openings 28, the contact resistance of lower portion 16 may be substantially lower. As a consequence, a device having a plurality of conductive structures may be fabricated having a relatively low average contact resistance. For example, in some embodiments, the removal of oxide layer 23 may facilitate the formation of a device comprising an average contact resistance less than or equal to approximately 20 ohms per contact, or more specifically, less than approximately 15 ohms per contact.

Figure 7:
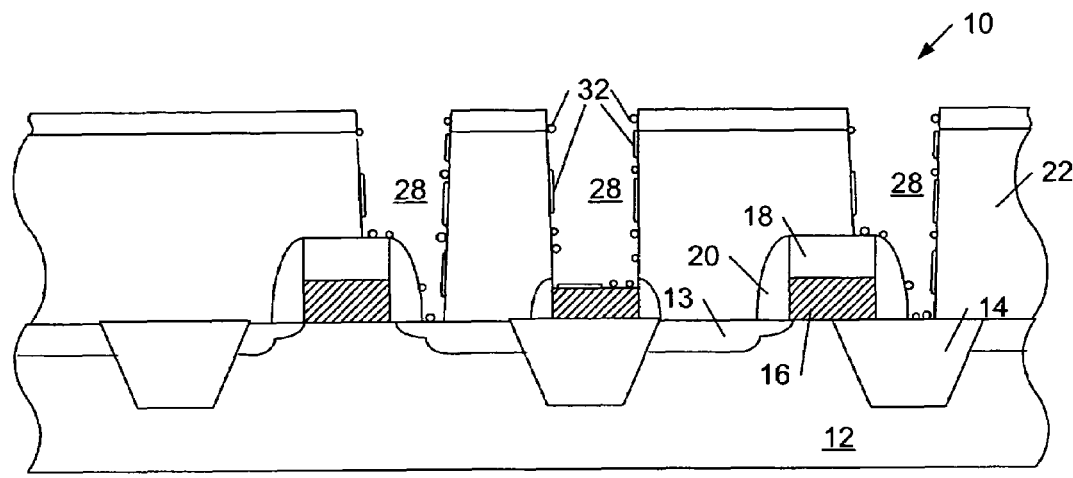
FIG. 7 depicts a partial cross-sectional view of the semiconductor topography having a metal oxide layer removed from a gate structure subsequent to the removal of the masking layer in FIG. 4.
Figure 8:
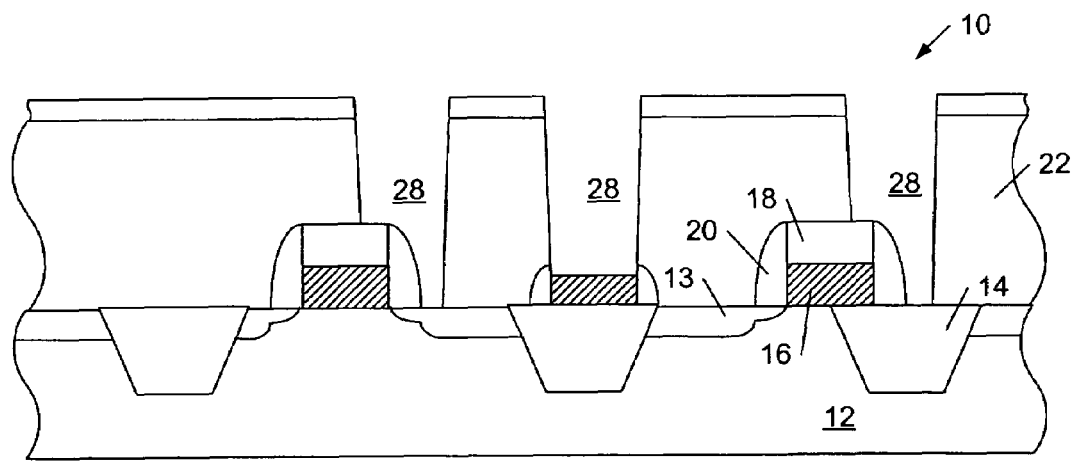
FIG. 8 depicts an exemplary cross-sectional view of the semiconductor topography in which etch residues are removed subsequent to the removal of the metal oxide layer in FIG. 7.

In some embodiments, the removal of metal oxide layer 23 may be conducted prior to the removal of residual material 32. In particular, the cleaning process described in reference to FIG. 5 may be performed prior to the metal oxide removal process described in FIG. 6. As such, an alternative sequence of processing steps is illustrated in FIGS. 7 and 8. In particular, FIG. 7 illustrates semiconductor topography 10 subsequent to the removal of metal oxide layer 23 from FIG. 4 yet prior to the removal of residual material 32. FIG. 8 illustrates semiconductor topography 10 subsequent to the removal of residual material 32 from FIG. 7 to produce a topography similar to the one illustrated in FIG. 6. In general, the topographies in FIGS. 6 and 8 may be substantially similar in that the upper surface of lower portion 16 may have a relatively low contact resistance and the gouging within semiconductor layer 12 may be limited to approximately 15 nanometers or, more preferably, approximately 10 nanometers.

Figure 9:
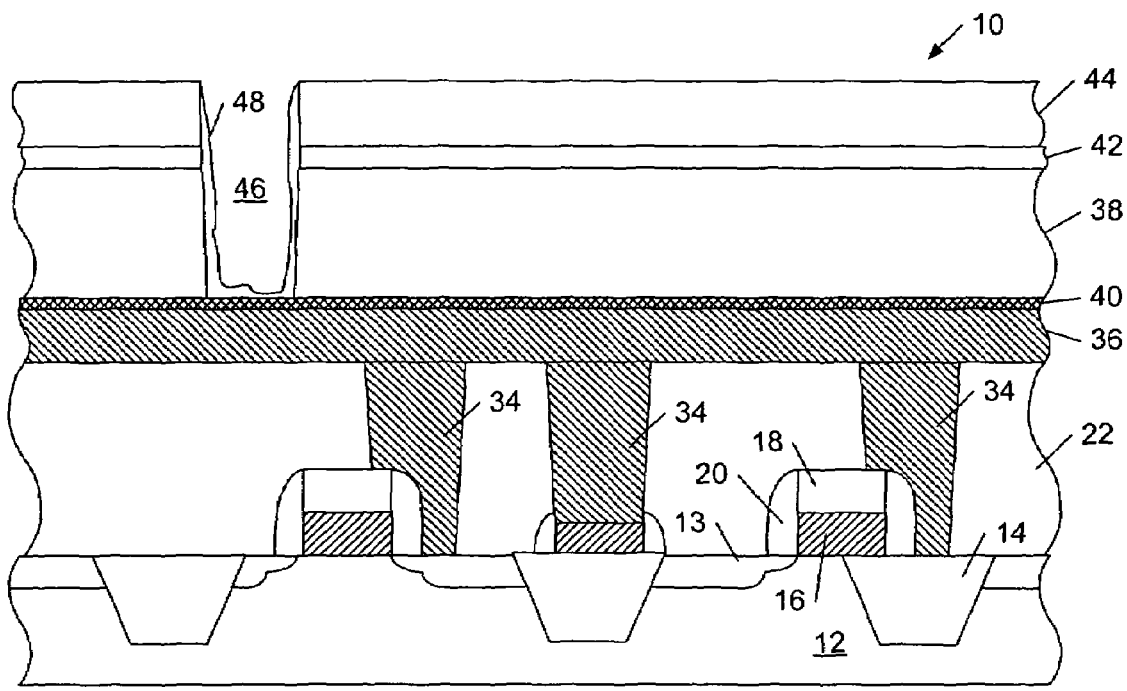
FIG. 9 depicts an exemplary cross-sectional view of the semiconductor topography having a plurality of structures and layers formed subsequent to the removal of the metal oxide layer in FIG. 6 or subsequent to the removal of etch residues in FIG. 8.

As noted above, the methods described herein may, in some embodiments, be used to clean and remove metal oxide layers within via openings formed within interlevel dielectric layers. An exemplary sequence of steps encompassing such an alternative use of the methods is illustrated and described in reference to FIGS. 9-11. In particular, FIG. 9 illustrates semiconductor topography 10 subsequent to the processes described in reference to FIGS. 6 and 8. As shown in FIG. 9, openings 28 may be filled to form contacts 34. In addition, interconnect line 36 may be formed above contacts 34. In general, contacts 34 and interconnect line 36 may include any conductive material, such as but not limited to aluminum, copper, titanium, tungsten, or any metal alloy thereof. In some embodiments, contacts 34 and interconnect line 36 may include the same material. In other cases, however, contacts 34 and interconnect line 36 may include different materials. In some embodiments, contacts 34 and interconnect line 36 may be formed simultaneously. In particular, a conductive material may be deposited within openings 28 and upon dielectric layer 22 and, subsequently, the conductive material may be planarized to a level above the upper surface of dielectric layer 22 to form contacts 34 and interconnect line 36. In other embodiments, the conductive material may be planarized to a level substantially coplanar with the upper surface of dielectric layer 22 to form contacts 34 without interconnect line 36. In such embodiments, interconnect line 36 may be formed in a separate process.

In either case, dielectric layer 38 may be deposited upon interconnect line 36 as shown in FIG. 9. Dielectric layer 38 may serve to isolate two levels of interconnect lines and, therefore, may be referred to as an interlevel dielectric layer. In general, dielectric layer 38 may include similar materials as described for dielectric layer 22 in reference to FIG. 2. In particular, dielectric layer 38 may include any dielectric material, such as but not limited to silicon dioxide, tetraorthosilicate glass, silicon nitride, silicon oxynitride, silicon dioxide/silicon nitride/silicon dioxide, borophosphorus silicate glass, phosphorus silicate glass, fluorine silicate glass or any low-permittivity ("low-k") dielectric. In some cases, dielectric layer 38 and dielectric layer 22 may include the same material. In other embodiments, however, dielectric layer 38 and dielectric layer 22 may include different materials. The thickness of dielectric layer 38 may generally be between approximately 100 angstroms and approximately 500 angstroms, but larger or smaller thicknesses may be employed, depending on the design specifications of the device. As shown in FIG. 9, the deposition of dielectric layer 38 may oxidize an upper portion of interconnect line 36 to form metal oxide layer 40.

Subsequent to the deposition of dielectric layer 38, cap layer 42 and masking layer 44 may be formed thereon. In general, cap layer 42 and masking layer 44 may include similar materials and thicknesses as those described for cap layer 24 and masking layer 26 in reference to FIG. 3. In particular, cap layer 42 may include undoped silicon dioxide and/or silicon nitride and may have a thickness between approximately 20 angstroms and approximately 500 angstroms. In addition, masking layer 44 may include hardmask and/or photoresist materials and may have a thickness between approximately 20 angstroms and approximately 1000 angstroms. Other materials and/or thicknesses, however, may be employed for cap layer 42 and masking layer 44, depending on the design specifications of the device. In general, masking layer 44 may be formed in a pattern with which to outline opening 46 within cap layer 42 and dielectric layer 38. The etch process used to form opening 46 may include similar techniques and etch chemistries described above in reference to the formation of openings 28 in FIG. 3. In particular, the etch process used for forming opening 46 may include wet etch or dry etch processes and an exemplary etch chemistry may include one or more halocarbons and/or one or more other fluorinated compounds. As shown in FIG. 9, polymer 48 may, in some embodiments, be formed from etching opening 46.

Figure 10:
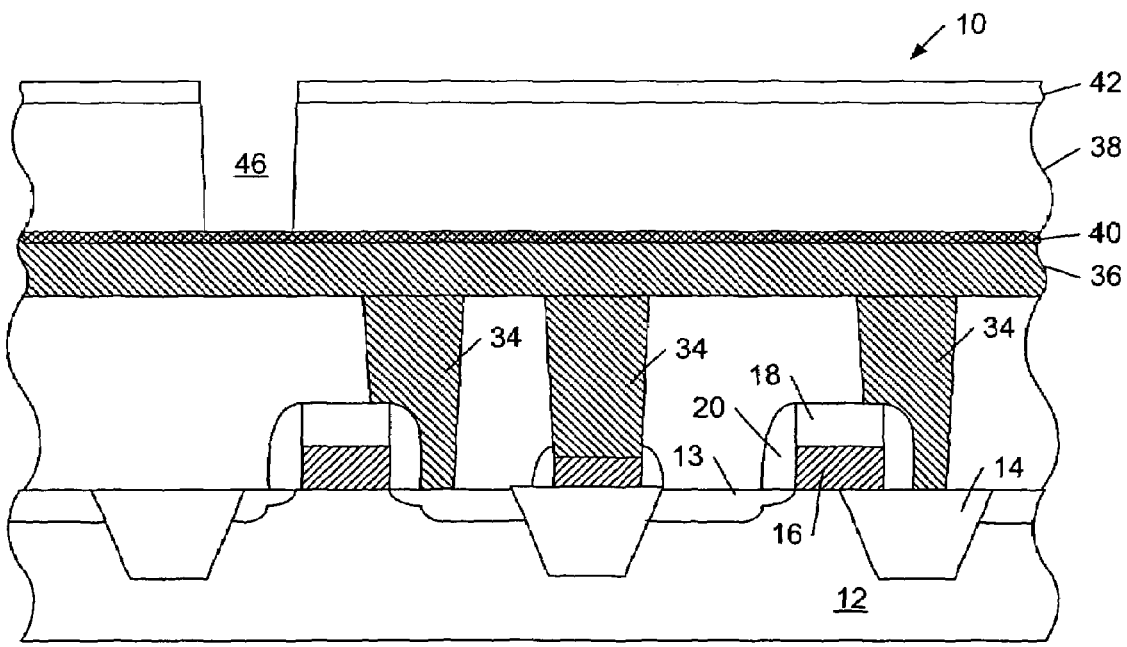
FIG. 10 depicts an exemplary cross-sectional view of the semiconductor topography having a masking layer removed and a via opening cleaned subsequent to the formation of the plurality of structure and layers in FIG. 9.

Turning to FIG. 10, semiconductor topography 10 is shown subsequent to the removal of masking layer 44 and polymer 48. In addition, FIG. 10 illustrates semiconductor topography 10 subsequent to the removal of residues formed from the removal of masking layer 44 and polymer 48. In general, the removal process of masking layer 44 and polymer 48 may be similar to the process described above for the removal of masking layer 26 and polymer 30 in reference to FIG. 4. For example, the removal of masking layer 44 and polymer 48 may, in some embodiments, include a dual-removal process such as may be provided the Iridia System, manufactured by Novellus Systems Incorporated. In other embodiments, the removal of masking layer 44 and polymer 48 may employ distinct etch chemistries.

In any case, material may still reside within opening 46 subsequent to the removal of masking layer 44 and polymer 48. Such residue may include etch byproducts from the formation of opening 46 and/or etch byproducts from the removal of masking layer 44 and polymer 48 and, therefore, may be similar to the composition described for residue 32 in reference to FIG. 4. As with residue 32, it may be advantageous to remove residual material within opening 46 such that material subsequently deposited within opening 46 may sufficiently adhere to the sidewalls and bottom surface of the openings. In general, the removal or cleaning of such residue from opening 46 may involve an etch chemistry distinct from the etch chemistry used to remove masking layer 44 and polymer 48. For instance, the cleaning process may, in some embodiments, use a PlasmaSolv® product provided by DuPont Electronic Technologies of Danville, Calif. as described above for the removal of residue 32 in reference to FIG. 4. Other etch chemistries, however, may also or alternatively be used. The temperature and duration of the cleaning process may be similar to temperature and duration ranges described for the cleaning process of residue 32 in reference to FIG. 4.

Figure 11:
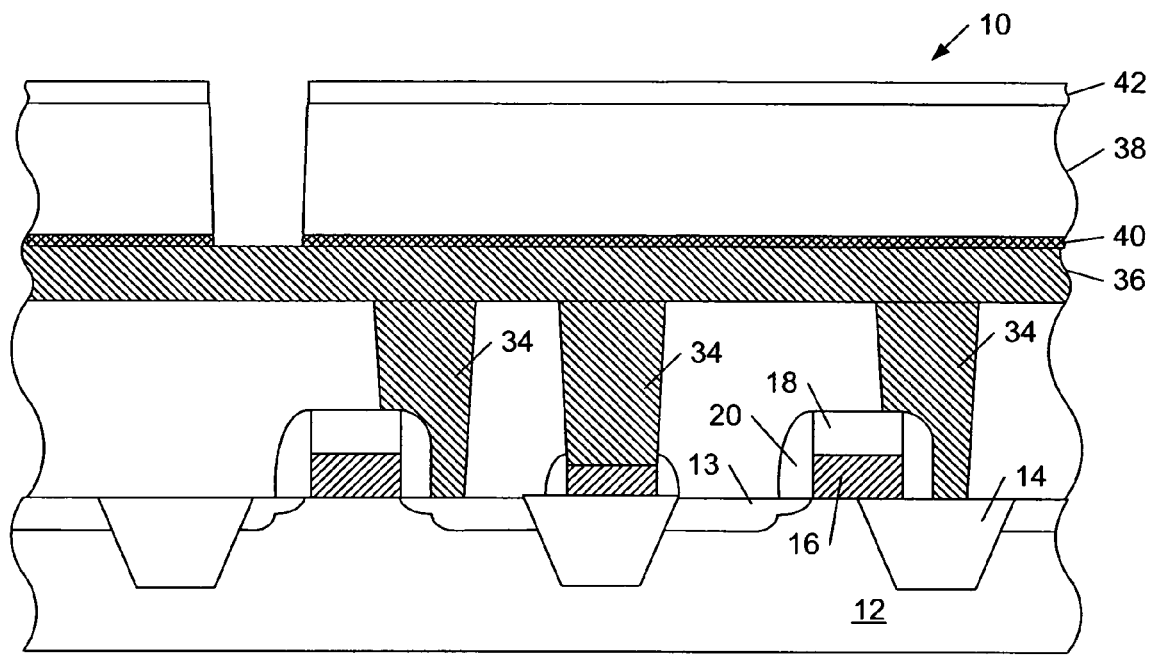
FIG. 11 depicts an exemplary cross-sectional view of the semiconductor topography having a metal oxide layer removed from the via opening subsequent to the cleaning of the via opening in FIG. 10.

Subsequent to the cleaning process, the portion of metal oxide layer 40 exposed by opening 46 may be removed as shown in FIG. 11. The removal process may be performed by any of the etch processes described above in reference to FIG. 6. In particular, the portion of metal oxide layer 40 exposed by opening 46 may be removed by any one of the etch chemistries described above for FIG. 6 and their associated process parameters, including temperature ranges, process durations, flow rates, and concentration ratios. For example, in some embodiments, the portion of metal oxide layer 40 exposed by opening 46 may removed by exposing semiconductor topography 10 to an etch chemistry which includes sulfuric acid and is substantially absent of hydrogen peroxide. Such an etch process may, in some embodiments, be followed by rinsing semiconductor topography 10 with deionized water which is substantially absent of ozone and drying the topography thereafter. In an alternative embodiment, the removal of the portion of metal oxide layer 40 exposed by opening 46 may include exposing semiconductor topography 10 to an etch chemistry comprising sulfuric acid and hydrogen peroxide. In yet other cases, the removal of the portion of metal oxide layer 40 exposed by opening 46 may include exposing the semiconductor topography to an etch chemistry comprising hydrochloric acid and hydrogen peroxide. Other alternative etch chemistries may also be used, such as but not limited to hydrogen peroxide alone or a mixture of nitric acid and sulfuric acid.

It is noted the process steps described in reference to FIGS. 10 and 11 may be employed in a different sequence than described above. In particular, the portion of metal oxide layer 40 exposed by opening 46 may be removed prior to the removal of the residual material generated from the removal of masking layer 44 and polymer 48. In particular, the cleaning process described in reference to FIG. 10 may be performed prior to the metal oxide removal process described in FIG. 11. In either case, semiconductor topography 10 may be exposed to additional processing steps subsequent to FIG. 11 in an effort to form a microelectronic device. Such additional processing steps may include but are not limited to the deposition of material within opening 46 and above dielectric layer 38. Since the portion of metal oxide layer 40 exposed by opening 46 is removed prior to the deposition of material within opening 46, the contact resistance of interconnect line 36 at the interface of opening 46 may be substantially lower. In particular, interconnect line 36 may have a contact resistance within opening 46 of less than or equal to approximately 20 ohms, or more specifically, less than approximately 15 ohms.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, method described herein may be applied to any topography including contact openings, including but not limited to those exposing conductive and silicon surfaces for the removal of a metal oxide layer within some of the contact openings. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:
   etching openings within a dielectric layer to expose at least one conductive surface and at least one silicon surface; and
   exposing the openings to an etch process adapted to remove metal oxide material from the at least one conductive surface without substantially removing material from the at least one silicon surface, wherein the etch process comprises removing a sufficient amount of the metal oxide material such that the conductive surface comprises an average surface resistance less than approximately 20 ohms.

2. The method of claim 1, wherein the etch process comprises removing less than approximately 15 nanometers of the silicon surface.

3. The method of claim 1, wherein the metal oxide material comprises tungsten oxide.

4. The method of claim 1, wherein the step of exposing the openings to the etch process comprises exposing the openings to an etch chemistry comprising sulfuric acid.

5. The method of claim 1, wherein the step of exposing the openings to the etch process comprises exposing the openings to an etch chemistry comprising hydrogen peroxide.

6. A method for processing a semiconductor topography, comprising:
   etching an opening within a dielectric layer to expose a conductive surface;
   removing a photoresist mask used to pattern the opening;
   cleaning the semiconductor topography of residues generated from the step of removing; and
   etching metal oxide material formed upon the exposed conductive surface with an etch chemistry comprising hydrogen peroxide and sulfuric acid, wherein the etch chemistry is distinct from chemistries used for the steps of removing and cleaning, and wherein the step of etching comprises removing a sufficient amount of the metal oxide material such that the exposed conductive surface comprises an average surface resistance less than approximately 20 ohms.

7. The method of claim 6, wherein the step of exposing the openings to the etch process comprises introducing the etch chemistry at a temperature between approximately 40° C. and approximately 170° C.

8. The method of claim 5, wherein the etch chemistry further comprises hydrochloric acid.

9. The method of claim 8, wherein the step of exposing the openings to the etch process comprises introducing the etch chemistry at a temperature between approximately 15° C. and approximately 45° C.

10. The method of claim 8, wherein the etch chemistry comprises a ratio of hydrochloric acid, hydrogen peroxide and deionized water between approximately 1:1:5 and approximately 1:1:20.

11. The method of claim 6, wherein the step of etching the exposed conductive surface is conducted subsequent to cleaning the semiconductor topography.

12. The method of claim 6, wherein the step of etching the exposed conductive surface is conducted prior to cleaning the semiconductor topography.

13. A method for processing a semiconductor topography, comprising:
   depositing a dielectric layer upon a metal structure;
   etching a trench within the dielectric layer to expose at least a portion of a metal oxide layer formed upon the metal structure during the step of depositing; and
   etching the exposed portion of the metal oxide layer with an etch chemistry comprising sulfuric acid to expose the metal structure, and wherein the step of etching the exposed portion of the metal oxide layer comprises removing a sufficient amount of the metal oxide material such that the exposed portion of the metal structure comprises an average surface resistance less than approximately 20 ohms.

14. The method of claim 13, wherein the etch chemistry is substantially absent of hydrogen peroxide, and wherein the method further includes rinsing the semiconductor topography with deionized water substantially absent of ozone subsequent to the step of etching the trench.

15. The method of claim 14, wherein the step of etching the exposed portion of the metal oxide layer comprises introducing the etch chemistry at a temperature between approximately 75° C. and approximately 300° C.

16. The method of claim 13, wherein the etch chemistry further comprises hydrogen peroxide.

17. The method of claim 16, wherein the etch chemistry comprises a ratio of sulfuric acid to hydrogen peroxide between approximately 5:1 and approximately 20:1.

18. The method of claim 13, wherein the etch chemistry further comprises nitric acid.

19. The method of claim 13, wherein the step of etching the trench with the dielectric layer further comprises etching another trench within the dielectric layer to expose a portion of a silicon surface.

* * * * *